United States Patent
Ding et al.

(10) Patent No.: US 8,723,572 B1
(45) Date of Patent: May 13, 2014

(54) APPARATUS AND METHODS TO CORRECT DIFFERENTIAL SKEW AND/OR DUTY CYCLE DISTORTION

(75) Inventors: Weiqi Ding, Fremont, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 91 days.

(21) Appl. No.: 13/436,385

(22) Filed: Mar. 30, 2012

(51) Int. Cl.
*H03K 5/12* (2006.01)

(52) U.S. Cl.
USPC .......................................... 327/170

(58) Field of Classification Search
None
See application file for complete search history.

(56) References Cited

U.S. PATENT DOCUMENTS

| | | | |
|---|---|---|---|
| 5,157,277 A | | 10/1992 | Tran et al. |
| 5,294,848 A | * | 3/1994 | Kannegundla ............... 327/269 |
| 6,081,162 A | * | 6/2000 | Johnson ....................... 330/301 |
| 6,933,759 B1 | | 8/2005 | Wu et al. |
| 7,661,010 B2 | | 2/2010 | DeFazio et al. |
| 8,258,825 B2 | * | 9/2012 | Hung et al. .................. 327/112 |
| 8,421,501 B1 | * | 4/2013 | Rien et al. .................... 326/81 |

\* cited by examiner

*Primary Examiner* — Lincoln Donovan
*Assistant Examiner* — Khareem E Almo
(74) *Attorney, Agent, or Firm* — Okamoto & Benedicto LLP

(57) ABSTRACT

One embodiment relates a method of correcting skew and/or duty cycle distortion in a differential signal using a transmitter buffer circuit. Skew and/or duty cycle distortion may be detected in the differential signal. Delay times for at least two variable-delay buffer circuits are adjusted. The variable-delay buffer circuits may have outputs coupled to control gates of pull-up and pull-down transistors coupled to one or more output nodes of the transmitter buffer circuit. Other embodiments, aspects, and features are also disclosed.

18 Claims, 7 Drawing Sheets

FIG. 4    400

APPARATUS AND METHODS TO CORRECT DIFFERENTIAL SKEW AND/OR DUTY CYCLE DISTORTION

BACKGROUND

1. Technical Field

The present invention relates generally to communication links including, but not limited to, serial interfaces for integrated circuits.

2. Description of the Background Art

High-speed transmitters often carry differential skew between its positive and negative terminals. Such differential skew may be, for example, due to variations and mismatches in devices and routing in the transmitter device. Such variations and mismatches may also cause duty cycle distortion which is observable as jitter in the transmission output in a half-rate transmitter architecture. Both differential skew and duty cycle distortion degrade the integrity of the signal output by a transmitter.

SUMMARY

One embodiment relates a method of correcting skew in a differential signal using a transmitter buffer circuit. Skew is detected in the differential signal. A delay time of a first variable-delay buffer circuit and a delay time of a second variable-delay buffer circuit are adjusted. The first variable-delay buffer circuit has an output coupled to a first terminal coupled to a first output node of the transmitter buffer circuit, while the second variable-delay buffer circuit has an output coupled to a second terminal coupled to the first output node of the transmitter buffer circuit. The delay time of the second variable-delay buffer circuit is adjusted by a same magnitude and in a same direction as the delay time of the first variable-delay buffer circuit.

Another embodiment relates to a method of correcting duty cycle distortion in a differential signal using a transmitter buffer circuit. Duty cycle distortion in the differential signal is detected. A delay time of a first variable-delay buffer circuit and a delay time of a second variable-delay buffer circuit are adjusted. The first variable-delay buffer circuit has an output coupled to a first terminal coupled to a first output node of the transmitter buffer circuit, while the second variable-delay buffer circuit has an output coupled to a second terminal coupled to the second output node of the transmitter buffer circuit. The delay time of the second variable-delay buffer circuit is adjusted by a same magnitude and in a same direction as the delay time of the first variable-delay buffer circuit.

Another embodiment relates to a transmitter buffer circuit which outputs a differential output signal composed of first and second single-ended output signals which are output on first and second output nodes, respectively. The transmitter buffer circuit includes first pull-up and pull-down transistors coupled to the first output node, and second pull-up and pull-down transistors coupled to the second output node. A first buffer is arranged to receive a first version of a first data input signal and output a first delayed data input signal to a control gate of the first pull-up transistor. A second buffer is arranged to receive a second version of the first data input signal and output a second delayed data input signal to a control gate of the first pull-down transistor. A third buffer is arranged to receive a first version of the second data input signal and output a third delayed data input signal to a control gate of the second pull-up transistor. Finally, a fourth buffer is arranged to receive a second version of the second data input signal an output a fourth delayed data input signal to a control gate of the second pull-down transistor. At least two of the four buffers each comprise a variable-delay buffer circuit which is independently controllable.

Other embodiments, aspects, and features are also disclosed.

DETAILED DESCRIPTION

The present disclosure provides methods and apparatus which advantageously address problems relating to differential skew and duty cycle distortion.

Figure 1:
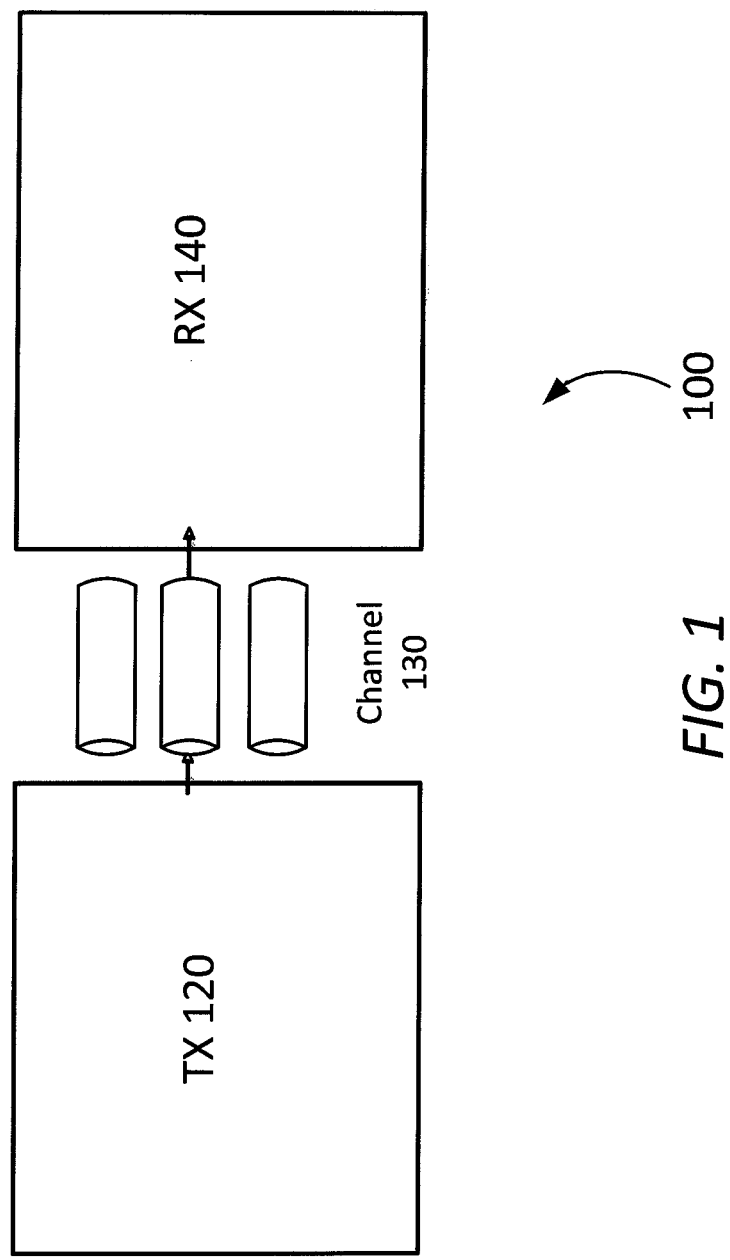
FIG. 1 is a high-level diagram of an exemplary communication link in accordance with an embodiment of the invention.

FIG. 1 is a high-level diagram of an exemplary communication link in accordance with an embodiment of the invention. As shown in FIG. 1, a communication link is generally composed of a transmitter (TX) circuit 120, a receiver (RX) circuit 140, and a communication channel (CH) 130 that is located in between the transmitter and the receiver. The channel 130 may be arranged to communicate a serial data signal from the transmitter 120 to the receiver 140. The channel 130 may use multiple lanes to communicate the serial data signal.

Figure 2:
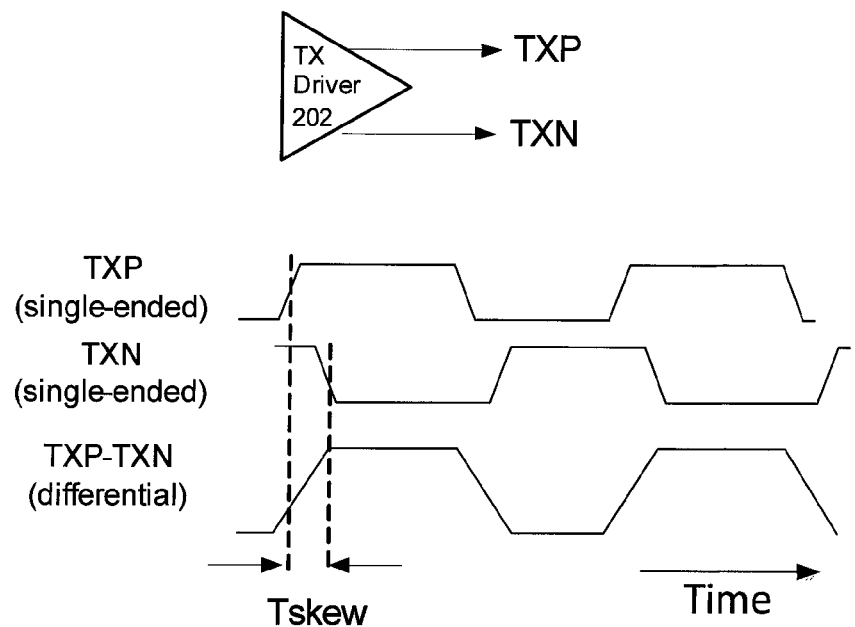
FIG. 2 is an illustrative example of differential skew in the differential output signal from a transmitter driver.

FIG. 2 is an illustrative example of differential skew in the differential output signal from a transmitter driver 202. As shown at the top part of FIG. 2, the transmitter driver 202 outputs a differential signal formed by single-ended signals TXP and TXN. As shown by the graphs on the bottom part of FIG. 2, there may be skew between the single-ended TXP and TXN signals. In the illustrated example, the TXN signal is delayed by time Tskew relative to the TXP signal.

Due to this differential skew, the rising and falling edges of the differential signal (TXP−TXN) have lower slopes (i.e. they are flatter) than they would be for a differential signal without skew. In other words, differential skew causes the rise and fall times of a differential signal to be increased. Severe skew further distorts the rising and falling edges and may cause reduction of the effective differential eye opening and other signal integrity issues.

Figure 3:
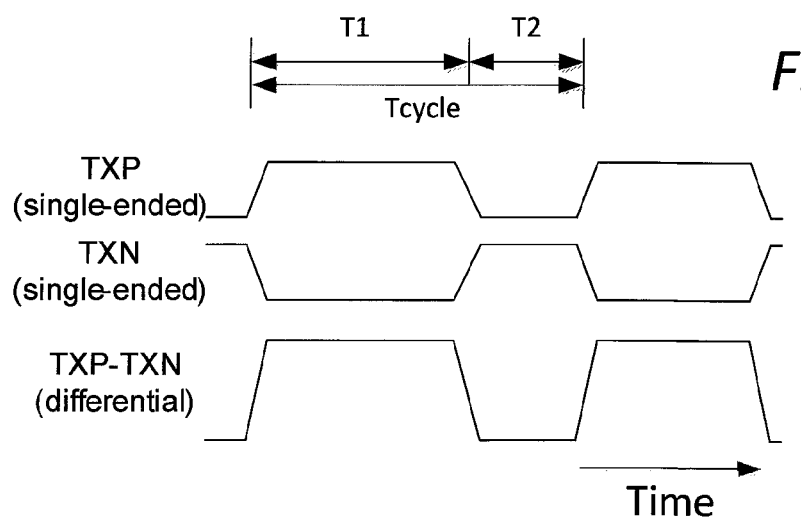
FIG. 3 is an illustrative example of duty cycle distortion in the differential output signal from a transmitter.

FIG. 3 is an illustrative example of duty cycle distortion in the differential output signal from a transmitter. As shown, each cycle of the differential output signal may have a total period time of Tcycle. Furthermore, each cycle may be divided into a first time period ("on time") T1 and a second time period ("off time") T2. The duty cycle may be defined as T1/Tcycle. In the ideal case, T1 is equal to T2 such that the duty cycle is 50%. In the case depicted in FIG. 3, T1 is longer than T2, such that the duty cycle is over 50%.

Such duty cycle distortion may show up as undesirable data dependent jitter at the output of a transmitter with a half-rate architecture. This may result in errors in the timing of the transitions.

Figure 4:
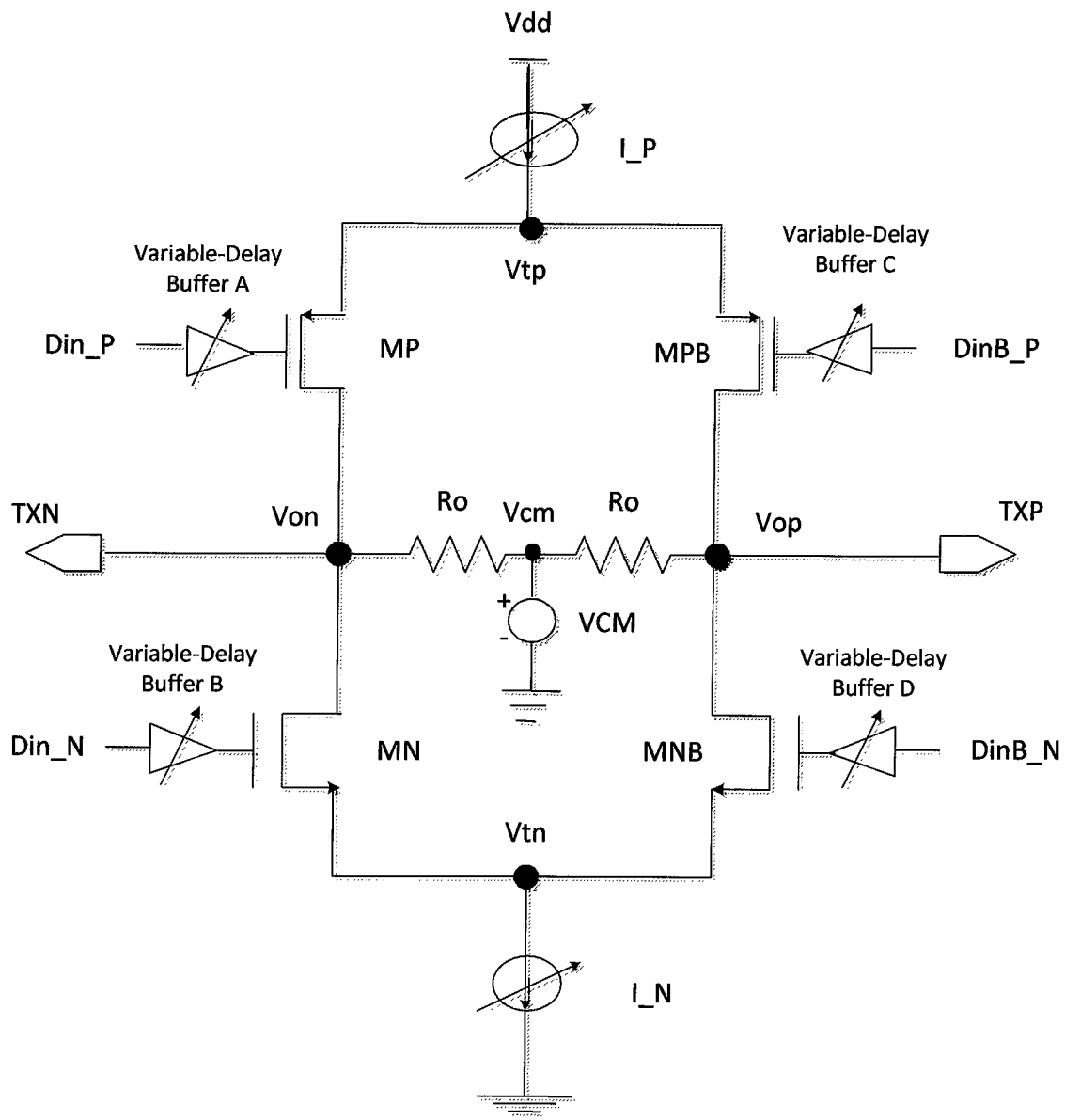
FIG. 4 depicts an exemplary transmitter buffer circuit in accordance with an embodiment of the invention.

FIG. 4 depicts an exemplary transmitter (TX) buffer circuit 400 in accordance with an embodiment of the invention. The exemplary TX buffer circuit 400 is based on an H-tree buffer structure. The H-tree buffer structure includes four switches (MP, MN, MPB, and MNB) and pull-up and pull-down current drivers (I_P and I_N).

The pull-up current driver (I_P) may be a variable current source connected in series between power supply voltage source (Vdd) and the node Vtp, while the pull-down current driver (I_n) may be a variable current source connected in series between ground and the node Vtn.

On the left side of the H-tree, PMOS transistor MP and NMOS transistor MN are connected in series between nodes Vtp and Vtn. In particular, node Vtp is connected to the source of MP, the drain of MP is connected to the source of MN at node Von, and the drain of MN is connected to the node Vtn. On the right side of the H-tree, PMOS transistor MPB and NMOS transistor MNB are also connected in series between nodes Vtp and Vtn. In particular, node Vtp is connected to the source of MPB, the drain of MPB is connected to the source of MNB at node Vop, and the drain of MNB is connected to the node Vtn.

Nodes Vop and Von are connected to differential outputs TXP and TXN, respectively, such that the final output signal is the differential signal (TXP−TXN). Two resistors Ro are connected in series between nodes Vop and Von. Common mode voltage node Vcm is located between the two resistors Ro and may be driven by a common mode driver VCM which may be a voltage source connected between Vcm and ground. In one specific implementation, Ro may be fifty ohms.

As shown in FIG. 4, four single-ended clocked data signals Din_P, Din_N, DinB_P, and DinB_N) may be used to control the four switches (MP, MN, MPB, and MNB, respectively). The use of four single-ended clocked data signals to generate a differential signal is due, in part, to the fact that the PMOS switches (MP and MPB) generally require different signals from the NMOS switches (MN and MNB) because of voltage level switching. In this case, Din_P and Din_N are two single-ended clocked data signals that are used to generate the TXN output, and DinB_P and DinB_N are two single-ended clocked data signals that are used to generate the TXP output.

In accordance with an embodiment of the invention, four variable-delay buffer circuits (buffer A, buffer B, buffer C, and buffer D) are incorporated into the TX buffer circuit 400 for purposes of providing a mechanism for adjusting differential skew and/or the duty cycle of the output signal. The delay of each variable-delay buffer circuit may be independently controllable.

In the embodiment shown, the variable-delay buffer circuit A (buffer A) has an input that receives clocked data signal Din_P and an output that is coupled to the control gate of the PMOS switch MP. The variable-delay buffer circuit B (buffer B) has an input that receives clocked data signal Din_N and an output that is coupled to the control gate of the NMOS switch MN. The variable-delay buffer circuit C (buffer C) has an input that receives clocked data signal Dinb_P and an output that is coupled to the control gate of the PMOS switch MPB. Finally, the variable-delay buffer circuit D (buffer D) has an input that receives clocked data signal DinB_N and an output that is coupled to the control gate of the NMOS switch MNB.

Figure 5:
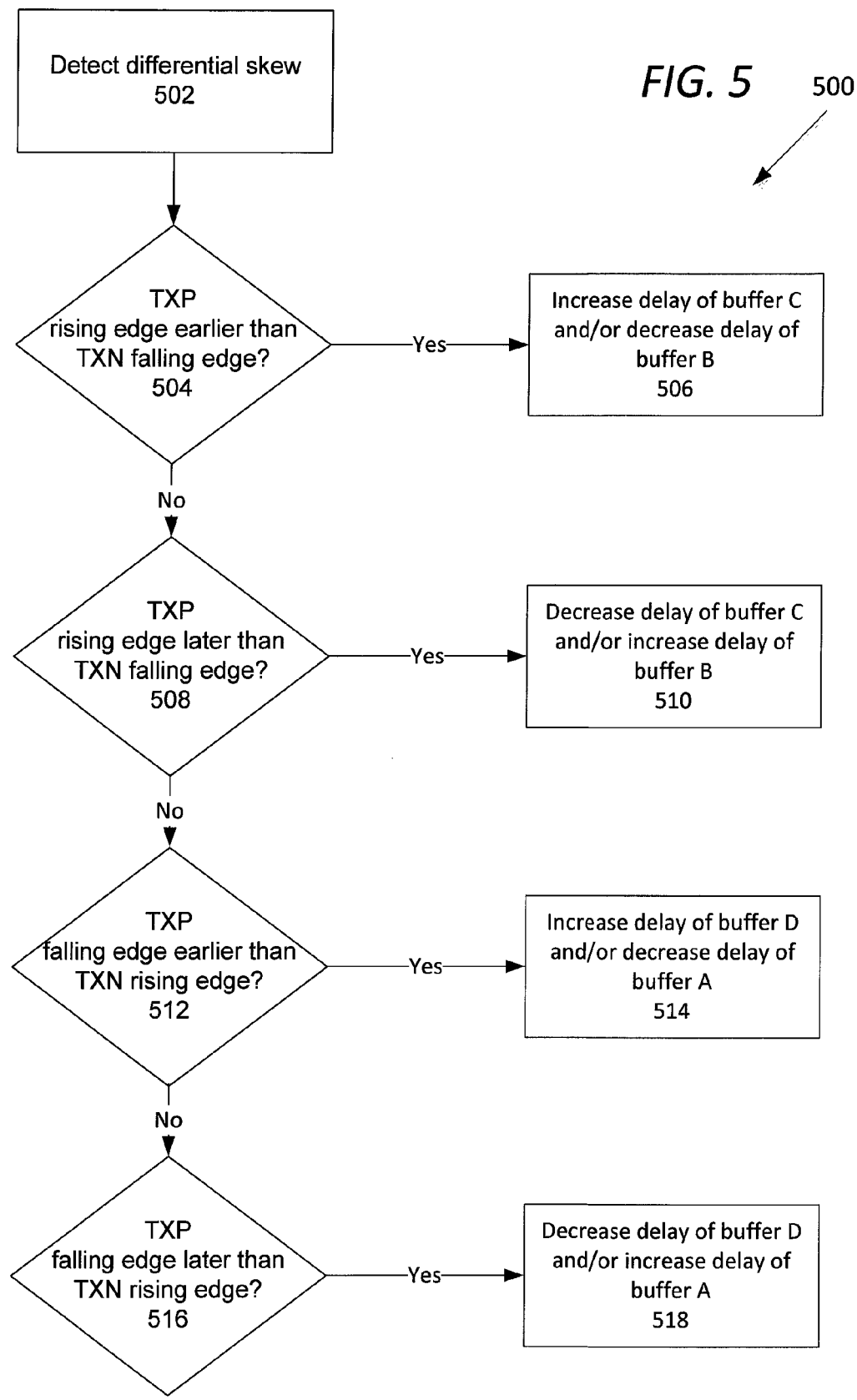
FIG. 5 is a flow chart of an exemplary method of correcting differential skew in accordance with an embodiment of the invention.

FIG. 5 is a flow chart of an exemplary method 500 of correcting differential skew in accordance with an embodiment of the invention. As described below, the method 500 may use the TX buffer circuit 400 described above in relation to FIG. 4.

Per block 502, differential skew may be detected in the differential data signal. The differential data signal may be composed of two single-ended clocked data signals: a TXP signal and a TXN signal. The detection of differential skew indicates that there is misalignment in the timing of the edges between the TXP and the TXN signals.

Per block 504, a determination may be made as to whether the rising edge of the TXP signal is earlier than the falling edge of the TXN signal. If so, then the delay of buffer C may be increased and/or the delay of buffer B may be decreased per block 506. As described above in relation to FIG. 4, buffer C is the variable-delay buffer circuit which has its output coupled to the control gate of the pull-up transistor for the TXP signal, and buffer B is the variable-delay buffer circuit which has its output coupled to the control gate of the pull-down transistor for the TXN signal.

Per block 508, a determination may be made as to whether the rising edge of the TXP signal is later than the falling edge of the TXN signal. If so, then the delay of buffer C may be decreased and/or the delay of buffer B may be increased per block 510.

Per block 512, a determination may be made as to whether the falling edge of the TXP signal is earlier than the rising edge of the TXN signal. If so, then the delay of buffer D may be increased and/or the delay of buffer A may be decreased per block 514. As described above in relation to FIG. 4, buffer D is the variable-delay buffer circuit which has its output coupled to the control gate of the pull-down transistor for the TXP signal, and buffer A is the variable-delay buffer circuit which has its output coupled to the control gate of the pull-up transistor for the TXN signal.

Per block 516, a determination may be made as to whether the falling edge of the TXP signal is later than the rising edge of the TXN signal. If so, then the delay of buffer D may be decreased and/or the delay of buffer A may be increased per block 518.

Figure 6:
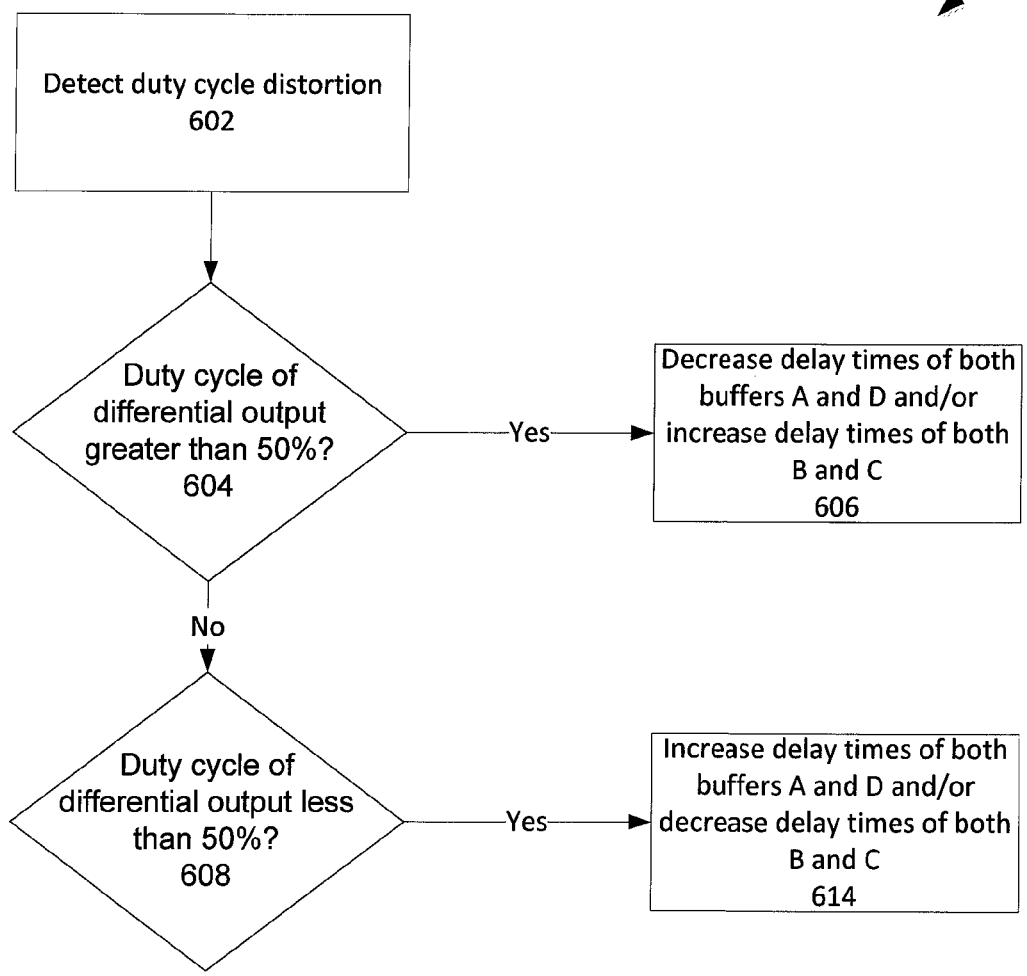
FIG. 6 is a flow chart of an exemplary method of correcting duty cycle distortion in accordance with an embodiment of the invention.

FIG. 6 is a flow chart of an exemplary method 600 of correcting duty cycle distortion in accordance with an embodiment of the invention. As described below, the method 600 may use the TX buffer circuit 400 described above in relation to FIG. 4.

Per block 602, duty cycle distortion may be detected in the differential data signal. The detection of duty cycle distortion typically indicates that the duty cycle is not fifty percent.

Per block 604, a determination may be made as to whether the duty cycle of the differential output signal is greater than fifty percent. If so, then the delays of both buffers A and D may be decreased by a same amount and/or the delays of buffers B and C may be increased by a same amount per block 606.

Per block 606, a determination may be made as to whether the duty cycle of the differential output signal is less than fifty percent. If so, then the delays of both buffers A and D may be increased by a same amount and/or the delays of buffers B and C may be decreased by a same amount per block 608.

Figure 7:
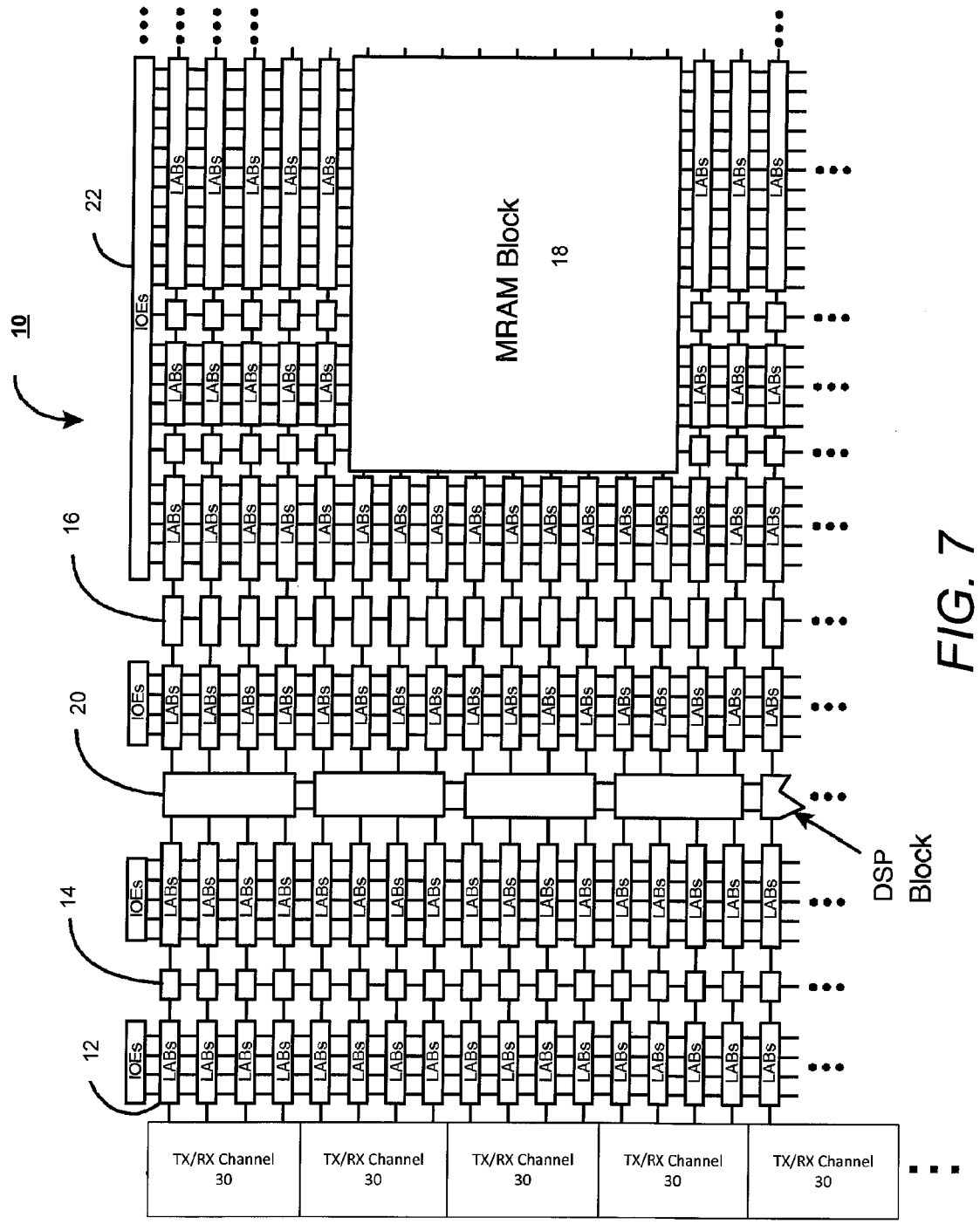
FIG. 7 is a simplified partial block diagram of an exemplary field programmable gate array (FPGA) that may be configured to implement an embodiment of the present invention.

FIG. 7 is a simplified partial block diagram of an exemplary field programmable gate array (FPGA) 10 that may be configured to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs). FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, a transmitter configured to with adjustable differential skew and duty cycle as described herein.

It is to be understood that FPGA 10 is described herein for illustrative purposes only and that the present invention can be implemented in many different types of PLDs, FPGAs, and ASICs.

Figure 8:
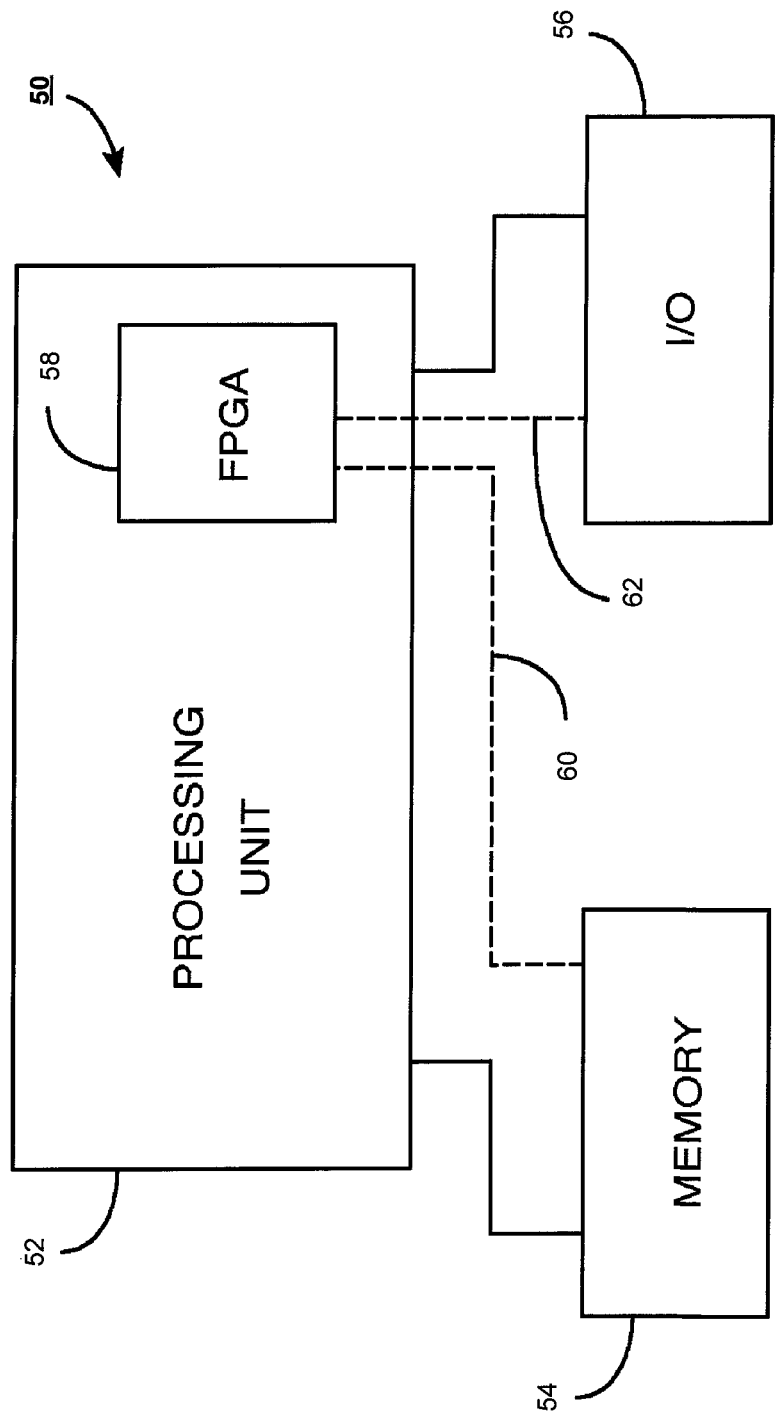
FIG. 8 shows a block diagram of an exemplary digital system that may employ PDN noise reduction techniques as disclosed herein.

FIG. 8 shows a block diagram of an exemplary digital system 50 that may employ techniques disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A method of correcting skew in a differential signal using a transmitter buffer circuit, the method comprising:
    detecting skew in the differential signal;
    adjusting a delay time of a first variable-delay buffer circuit which has an output coupled to a first terminal coupled to a first output node of the transmitter buffer circuit; and
    adjusting a delay time of a second variable-delay buffer circuit which has an output coupled to a second terminal coupled to the first output node of the transmitter buffer circuit,
    wherein the delay time of the second variable-delay buffer circuit is adjusted by a same magnitude and in a same direction as the delay time of the first variable-delay buffer circuit.

2. The method of claim 1, wherein the first terminal comprises a control gate of a first pull-up transistor coupled to the first output node of the transmitter buffer circuit, and the second terminal comprises a control gate of a first pull-down transistor coupled to the first output node of the transmitter buffer circuit.

3. A method of correcting skew in a differential signal using a transmitter buffer circuit, the method comprising:
    detecting skew in the differential signal;
    adjusting a delay time of a first variable-delay buffer circuit which has an output coupled to a first terminal coupled to a first output node of the transmitter buffer circuit, wherein the first terminal comprises a control gate of a first pull-up transistor coupled to the first output node of the transmitter buffer circuit; and
    adjusting a delay time of a second variable-delay buffer circuit which has an output coupled to a second terminal coupled to the first output node of the transmitter buffer circuit, wherein the second terminal comprises a control gate of a first pull-down transistor coupled to the first output node of the transmitter buffer circuit, and wherein the delay time of the second variable-delay buffer circuit is adjusted by a same magnitude and in a same direction as the delay time of the first variable-delay buffer circuit;

receiving a first single-ended clocked data signal by the first variable-delay buffer circuit;
receiving a second single-ended clocked data signal by the second variable-delay buffer circuit;
receiving a third single-ended clocked data signal by a third buffer circuit which has an output coupled to a control gate of a second pull-up transistor coupled to a second output node of the transmitter buffer circuit; and
receiving a fourth single-ended clocked data signal by a fourth buffer circuit which has an output coupled to a control gate of a second pull-down transistor coupled to the second output node of the transmitter buffer circuit.

4. The method of claim 3, wherein the first output node outputs a TXN signal while the second output node outputs a TXP signal, and the differential signal comprises the TXP and the TXN signals.

5. The method of claim 3, wherein the first output node outputs a TXP signal while the second output node outputs a TXN signal, and the differential signal comprises the TXP and the TXN signals.

6. The method of claim 1, wherein the transmitter buffer circuit comprises an H-tree buffer structure.

7. A method of correcting duty cycle distortion in a differential signal using a transmitter buffer circuit, the method comprising:
detecting duty cycle distortion in the differential signal;
adjusting a delay time of a first variable-delay buffer circuit which has an output coupled to a first terminal coupled to a first output node of the transmitter buffer circuit; and
adjusting a delay time of a second variable-delay buffer circuit which is coupled to a second terminal coupled to a second output node of the transmitter buffer circuit,
wherein the delay time of the second variable-delay buffer circuit is adjusted by a same magnitude and in a same direction as the delay time of the first variable-delay buffer circuit.

8. The method of claim 7, wherein the first terminal comprises a control gate of a first pull-up transistor coupled to the first output node of the transmitter buffer circuit, and the second terminal comprises a control gate of a first pull-down transistor coupled to the first output node of the transmitter buffer circuit.

9. A method of correcting duty cycle distortion in a differential signal using a transmitter buffer circuit, the method comprising:
detecting duty cycle distortion in the differential signal;
adjusting a delay time of a first variable-delay buffer circuit which has an output coupled to a first terminal coupled to a first output node of the transmitter buffer circuit, wherein the first terminal comprises a control gate of a first pull-up transistor coupled to the first output node of the transmitter buffer circuit; and
adjusting a delay time of a second variable-delay buffer circuit which is coupled to a second terminal coupled to a second output node of the transmitter buffer circuit, wherein the second terminal comprises a control gate of a first pull-down transistor coupled to the first output node of the transmitter buffer circuit, and wherein the delay time of the second variable-delay buffer circuit is adjusted by a same magnitude and in a same direction as the delay time of the first variable-delay buffer circuit;
receiving a first single-ended clocked data signal by the first variable-delay buffer circuit;
receiving a second single-ended clocked data signal by the second variable-delay buffer circuit;
receiving a third single-ended clocked data signal by a third buffer circuit which has an output coupled to a control gate of a second pull-up transistor coupled to the second output node of the transmitter buffer circuit; and
receiving a fourth single-ended clocked data signal by a fourth buffer circuit which has an output coupled to a control gate of a second pull-down transistor coupled to the first output node of the transmitter buffer circuit.

10. The method of claim 9, wherein the differential signal comprises a TXP signal and a TXN signal, and wherein the first output node outputs the TXN signal while the second output node outputs the TXP signal.

11. The method of claim 9, wherein the differential signal comprises a TXP signal and a TXN signal, and wherein the first output node outputs the TXP signal while the second output node outputs the TXN signal.

12. The method of claim 7, wherein the transmitter buffer circuit comprises an H-tree buffer structure.

13. A transmitter buffer circuit comprising:
first and second output nodes for outputting first and second single-ended output signals, respectively, wherein a differential output signal comprises the first and second single-ended output signals;
a first pull-up transistor coupled to the first output node;
a first pull-down transistor coupled to the first output node;
a second pull-up transistor coupled to the second output node;
a second pull-down transistor coupled to the second output node;
a first buffer arranged to receive a first version of a first data input signal and output a first delayed data input signal to a control gate of the first pull-up transistor;
a second buffer arranged to receive a second version of the first data input signal and output a second delayed data input signal to a control gate of the first pull-down transistor;
a third buffer arranged to receive a first version of the second data input signal and output a third delayed data input signal to a control gate of the second pull-up transistor; and
a fourth buffer arranged to receive a second version of the second data input signal an output a fourth delayed data input signal to a control gate of the second pull-down transistor,
wherein at least two of the four buffers each comprises a variable-delay buffer circuit which is independently controllable.

14. The transmitter buffer circuit of claim 13, wherein at least the first and second buffers each comprises a variable-delay buffer circuit which is independently controllable, and wherein delay times of the first and second buffers are changed by a same magnitude in a same direction to adjust a skew of the differential signal.

15. The transmitter buffer circuit of claim 13, wherein at least the first and fourth buffers each comprises a variable-delay buffer circuit which is independently controllable, and wherein delay times for the first and fourth buffers are changed by a same magnitude and direction to adjust a duty cycle of the differential signal.

16. The transmitter buffer circuit of claim 13, further comprising:
a first resistor coupled between the first output node and a common mode voltage node; and
a second resistor coupled between the second output node and the common mode voltage node.

17. The transmitter buffer circuit of claim 13, further comprising:
a first current supply coupled between a voltage supply and sources of the first and second pull-up transistors; and a second current supply coupled between a ground node and sources of the first and second pull-down transistors.

18. The transmitter buffer circuit of claim 13, wherein the transmitter buffer circuit is in a transceiver circuit on a field programmable gate array.

\* \* \* \* \*